(12) United States Patent
Grayver et al.

(10) Patent No.: US 7,970,084 B2
(45) Date of Patent: Jun. 28, 2011

(54) COMMUNICATIONS ADAPTIVE AUTOMATIC GAIN CONTROLLER

(75) Inventors: Eugene Grayver, Los Angeles, CA (US); Eric J. McDonald, Culver City, CA (US); Neil Morgan, Torrance, CA (US)

(73) Assignee: The Aerospace Corporation, El Segundo, CA (US)

( * ) Notice: Subject to any disclaimer, the term of this patent is extended or adjusted under 35 U.S.C. 154(b) by 912 days.

(21) Appl. No.: 11/900,251

(22) Filed: Sep. 11, 2007

(65) Prior Publication Data

US 2009/0067556 A1 Mar. 12, 2009

(51) Int. Cl.
*H04L 27/08* (2006.01)
*H03K 9/00* (2006.01)

(52) U.S. Cl. .......................... 375/345; 375/316

(58) Field of Classification Search ............... 375/345, 375/316
See application file for complete search history.

(56) References Cited

U.S. PATENT DOCUMENTS

| 6,510,188 | B1 * | 1/2003 | Isaksen et al. | 375/345 |
| 6,694,131 | B1 * | 2/2004 | Lakkis | 455/302 |
| 7,333,603 | B1 * | 2/2008 | Sallaway et al. | 379/391 |
| 2004/0022228 | A1 * | 2/2004 | Tyra et al. | 370/342 |
| 2006/0198454 | A1 * | 9/2006 | Chung et al. | 375/260 |

* cited by examiner

*Primary Examiner* — Dac V Ha
*Assistant Examiner* — Brian J Stevens
(74) *Attorney, Agent, or Firm* — K & L Gates LLP

(57) ABSTRACT

An adaptive scaling processor operates in combination with a conventional automatic gain control controller providing an amplification gain A to m-ary symbol-modulated communication signals, the scaling processor scaling by a scaling factor Z the m-ary communication signal for providing an overall gain of an (A)(Z) product minimizing the BER that is optimum for the communications channel for improved BER performance in communication systems.

7 Claims, 3 Drawing Sheets

ADAPTIVE AGC CONTROLLER

TABLE ADAPTIVE PROCESSOR

BER ADAPTIVE PROCESSOR

ADAPTIVE BER PERFORMANCE

COMMUNICATIONS ADAPTIVE AUTOMATIC GAIN CONTROLLER

FIELD OF THE INVENTION

The invention relates to the field of communication systems. More particularly, the present invention relates to gain control for received signals defined within a communications electronic constellation space for reduced error rates.

BACKGROUND OF THE INVENTION

Communication systems use high-powered transmitter amplifiers to transmit a communications signal. Any amplifier exhibits nonlinear behavior when operating close to saturation at a maximum output power level. Operating at saturation injects nonlinear distortion. The nonlinearity can be characterized into two types. Amplitude modulation nonlinearity occurs where an incremental change in input signal power does not correspond to a linear incremental change in the output power. Phase modulation nonlinearity occurs when an incremental change in input signal power results in a phase change of the output signal. Operating as close to saturation as possible maximizes the output power and thereby maximizes overall amplifier efficiency. However, these nonlinear effects become more severe closer to saturation and eventually degrade the performance such that a communications link can no longer be maintained.

A decision-directed approach is typically used for m-ary multi-level modulations methods, such as conventional 16-QAM modulation. U.S. Pat. No. 6,154,503 describes an automatic gain control system that responds to baseband signal distortion. The automatic gain control (AGC) system monitors the distortion of the outer constellation points of a complex modulation format such as quadrature amplitude modulation (QAM) and adjusts both the RF and IF AGC gain to minimize such distortion. This receiver contains at least two stages of AGC gain. Typically, the RF AGC amplifier is contained in the tuner that is followed by an IF AGC amplifier. The IF amplifier is coupled to a mixer and an associated low pass filter which, in combination and when driven by a particular frequency, produces a baseband or near baseband signal. The baseband signal is digitized and processed by a gain control circuit. The gain control circuit produces IF and RF AGC signals that control the gain of the respective AGC stages.

Modern cell phone standards rely on high order modulations and require a low BER, and are well suited for decision directed gain control. Automatic gain control is employed on all modern receivers to insure that the received signal level is scaled to the desired amplitude and does not depend on the channel attenuation. The output of an AGC is an AGC adjusted input Y given by $Y = A \cdot X = A(I+jQ)$, where A is the gain, X is the input having real components I and imaginary components Q. An AGC slicer is used for determining symbol points within a predetermined constellation space from quadrature analog values of an input signal. The AGC may be performed at radio frequency, intermediate frequency, or in the digital domain. Two AGC algorithms are commonly used: power-directed and decision-directed. The error between the desired signal and actual signal for a power-directed method is a function of the average received power P, $e = |I_{IN} + jQ_{IN}| - P$. The error between the desired signal and actual signal for a decision-directed method is $e = (I_{IN} - \hat{I})\text{sign}(\hat{I}) + (Q_{IN} - \hat{Q})\text{sign}(\hat{Q})$, where $\hat{I}$ and $\hat{Q}$ indicate quadrature decisions. A receiver may employ both algorithms by cascading a power-directed AGC followed by a decision directed AGC.

Signals with variable envelope experience more corruption than do constant-envelope signals. For example, a 16-QAM modulated signal is corrupted more than an 8-PSK signal. A multilevel constellation used in communication systems is impacted by amplifier saturation distortion. Outer points of the constellation are amplified less than the inner points in the constellation and therefore the outer points appear compressed towards the origin of the constellation. Inner points of the constellation are rotated relative to the outer points. This compression and rotation causes bit error rates as the transmitted signals are expected to be in alignment with the constellations but are distorted away from the expected points. The automatic gain control (AGC) subsystems are standard on all modern receivers. The standard AGC subsystem uses gain control algorithms that are suboptimal when a nonlinear power amplifier distorts the received signal. This suboptimal behavior increases the bit error rate (BER). These and other disadvantages are solved or reduced using the invention.

SUMMARY OF THE INVENTION

An object of the invention is to provide an automatic gain controller.

Another object of the invention is to provide an automatic gain controller for reducing bit error rates.

Yet another object of the invention is to reduce error rates in the presence of nonlinear distortion.

Still another object of the invention is to provide an automatic gain controller for reducing bit error rates by determining a gain scaling factor.

A further object of the invention is to provide an automatic gain controller for reducing bit error rates by determining a gain scaling factor determined by a look-up table.

Yet a further object of the invention is to provide an automatic gain controller for reducing bit error rates by determining a gain scaling factor determined by the bit error rate.

The invention is an automatic gain control (AGC) controller for reducing bit error rates (BER) in m-ary modulation communication systems. The controller is used for computing an optimal automatic gain control scaling factor. The controller perfects a method for adaptively determining the scaling. The controller provides adaptive processors for implementing the algorithms. The algorithms take into account the interaction between constellation distortion and forward error correction. The controller algorithms implement a decision directed approach for multi-level modulations, such as 16-QAM. The AGC algorithm determines a gain as a scaling factor that minimizes the average bit error rate. The scaling of the automatic gain reduces the number of errors made by the receiver. This scaling change may be accomplished either entirely in software or with a negligible change to the hardware. The controller is therefore suitable for both newly developed receivers and for upgrading existing receivers.

Discovery is made that the behavior of a nonlinearly amplified 16-QAM signal revealed a strong dependence on the AGC scaling. The optimal value for a distorted constellation is not equal to that for an undistorted constellation. The optimality criterion is defined as minimum BER. The optimal scaling depends strongly on the amount of the distortion and weakly on the signal to noise ratio. The amount of distortion is directly related to the operating point of the amplifier relative to saturation. The computed scaling factor is based on the expected operating parameters best applicable to links with known and constant channel parameters. The distortion level is injected by the amplifier at the transmitter. For example, a satellite downlink channel with a directional antenna at the receiver can be characterized as known and constant. The precomputed constant may be either a scalar or a vector indexed by the estimated signal to noise ratio. The adaptive gain controller improves the BER performance of high-order m-ary modulation methods in the presence of nonlinear distortion. These and other advantages will become more apparent from the following detailed description of the preferred embodiment.

DETAILED DESCRIPTION OF THE PREFERRED EMBODIMENT

Figure 1:
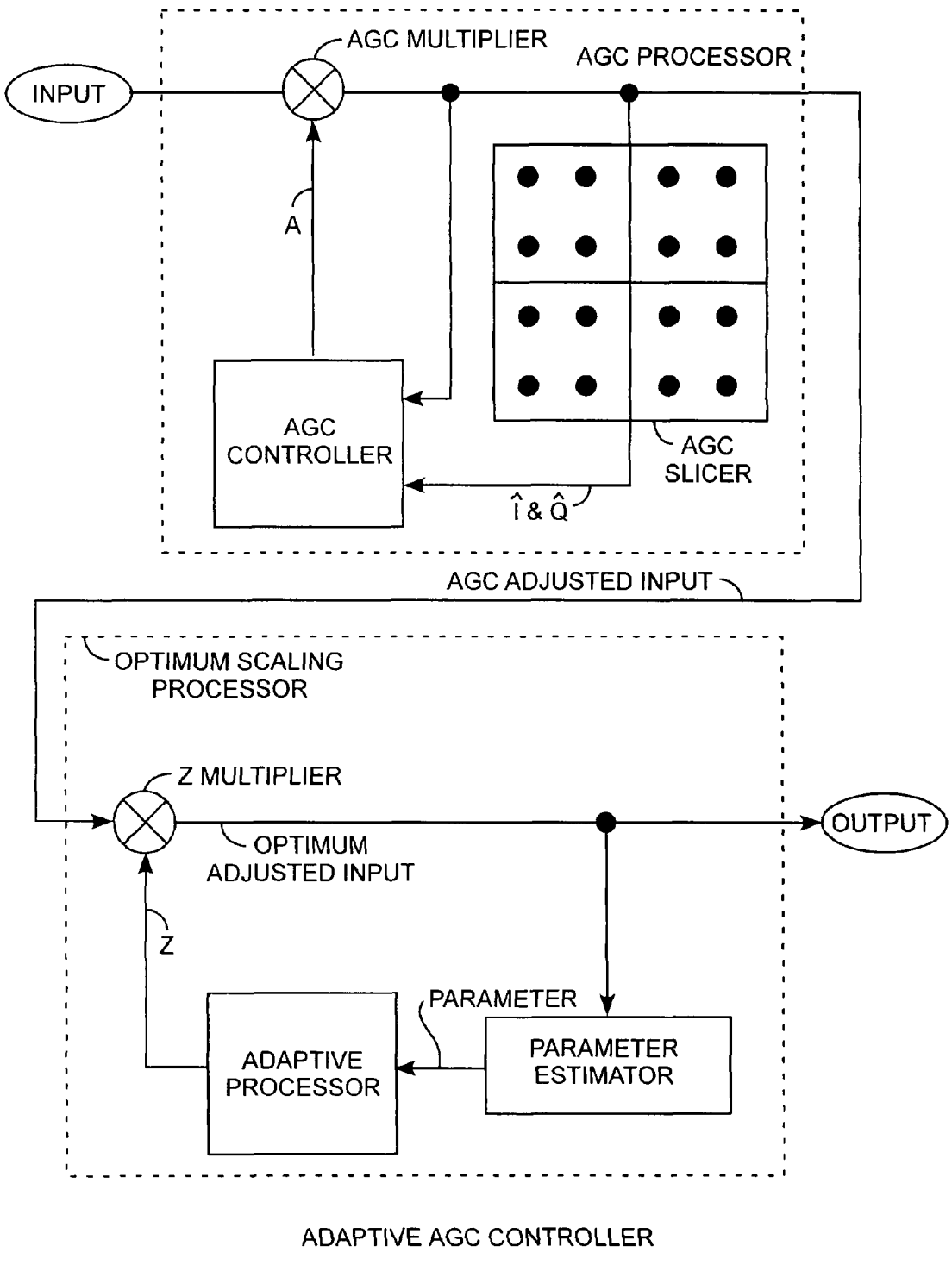
FIG. 1 is a block diagram of an adaptive AGC controller.

An embodiment of the invention is described with reference to the figures using reference designations as shown in the figures. Referring to FIG. 1, an adaptive automatic gain control controller provides for automatic gain control (AGC) of an input signal using a conventional AGC processor. The input signal may be either a complex baseband signal or an intermediate frequency (IF) signal. An AGC multiplier amplifies the input signal by an amplification gain factor A into an AGC adjusted input. The amplification gain A is computed in a conventional AGC controller. The AGC controller receives the AGC adjusted input and a hard decision symbol $\hat{I}+j\hat{Q}$. An AGC slicer makes a hard decision as to which symbol the AGC adjusted input signal is most closely aligned. The hard decision is based upon a predetermined constellation space, represented in quadrature by sixteen points within a preferred 16-ary modulation method.

The AGC controller employs conventional power-directed method or decision-directed method, or both, for determining the amplification gain A. Regardless of the conventional algorithm used, the AGC controller continuously adapts the gain factor A such that the gain error value e in the conventional algorithm is minimized. An AGC slicer receives the AGC adjusted input and outputs one of the previously defined constellation points. The constellation point closest in the Euclidean distances to the scaled input is selected. The adjusted AGC input is then the output of the AGC processor as in conventional systems. The AGC processor, comprising the AGC multiplier, AGC controller, and AGC slicer is a conventional AGC processor for a 16-ary modulation communications system. The AGC adjusted input is communication to a optimum scaling processor.

The optimum scaling processor includes a Z multiplier, an adaptive processor, and a parameter estimator. The Z multiplier scales the AGC adjusted input into an optimal scaling input by a factor Z. The output of the Z multiplier is considered optimally adjusted to minimize the system BER. The scaling factor Z is computed in the adaptive processor. The adaptive processor receives a signal to noise ratio (SNR) parameter and a BER parameter that is proportional to a current BER. The SNR and BER parameters are estimated by a parameter estimator.

The parameter estimator computes the SNR parameter. The parameter estimator can compute the SNR parameter using conventional methods. One such conventional method is a split symbol moments estimator. The parameter estimator can compute the BER parameter using conventional methods. The BER parameter may alternatively be generated using conventional components, such as an iterative decoder or a frame-error-rate based on cyclic redundancy check (CRC) decoder, both not shown.

Figure 2A:
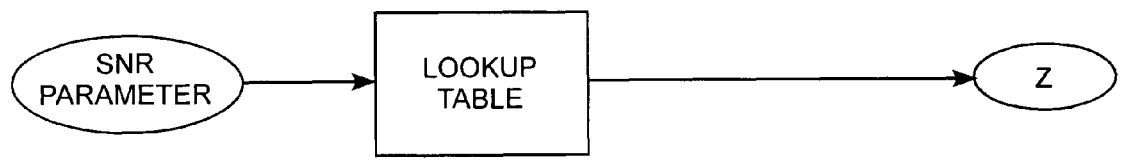
FIG. 2 is a block diagram of a table adaptive processor.
Figure 2B:
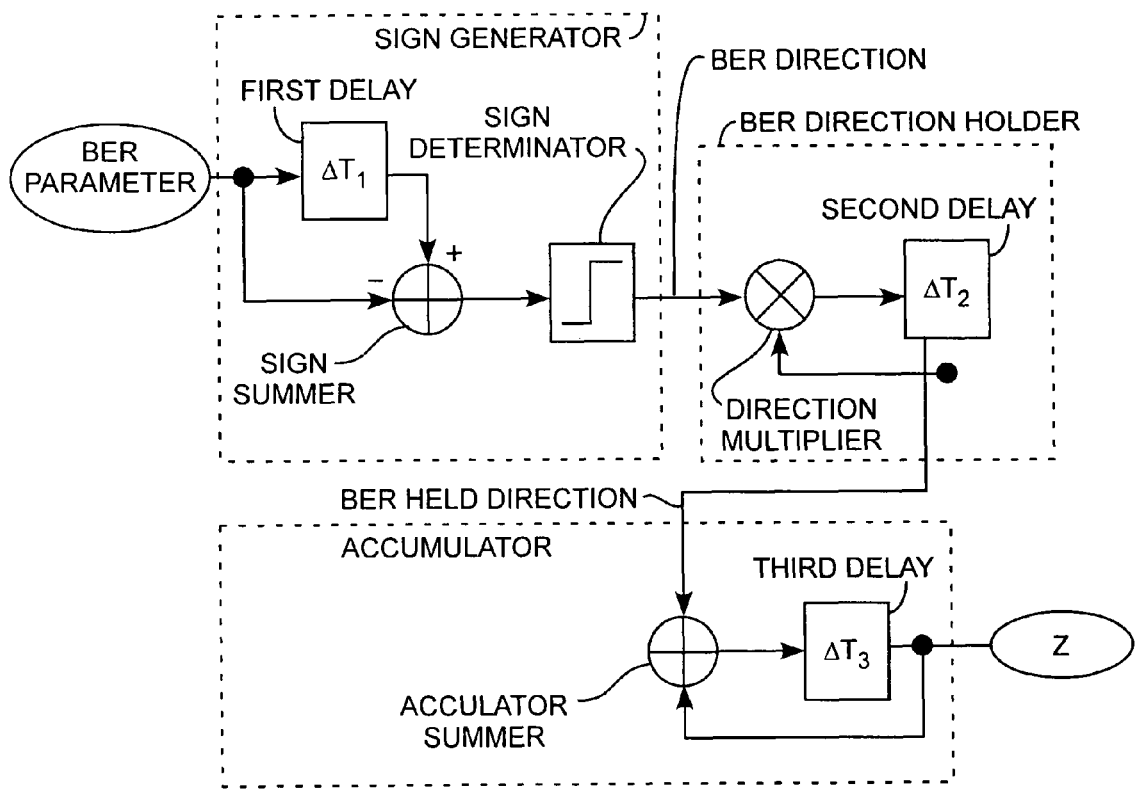

Referring to FIGS. 1, 2A and 2B, the adaptive algorithm processor can be implemented in various forms. A look up table adaptive implementation uses the SNR parameter using precomputation. The table adaptive processor is most applicable to a link with known and constant channel parameters. The distortion level is determined by the amplifier at the transmitter. For example, a satellite downlink channel with a directional antenna at the receiver can be characterized as known and constant. The table adaptive processor is merely a lookup table that is precomputed based on known nonlinear distortion level. This precomputation is typically performed off-line based upon modeling and measuring performance characteristics of a communication channel. The precomputation also depends on the exact implementation of the AGC processor. The over all gain α is equal to the product of the amplification gain A times the scaling factor Z. The scaling factor Z values in the lookup table are indexed to the SNR parameter.

The lookup table values are computed by minimizing the error probability equation $P_S(E)$ under the expected level of distortion. The signal-to-noise ratio is defined as $\gamma_S = E_S/N_O$ where $E_S$ is the average symbol energy. The constellation points of an undistorted 16-QAM constellation fall on three distinct radii. The inner most is denoted as $r_1 = (\sqrt{2})d$ the intermediate as $r_2 = (\sqrt{10})d$ and the outer most as $r_3 = 3(\sqrt{2})d$, where d is the decision distance of the constellation. Based on these radii, two domains are specified as domain equations that is the amount of distortion induced by amplifier nonlinearity with $D_1 = \{r_{SAT}: r_2 < r_{SAT} \leq r_3\}$ and $D_2 = \{r_{SAT}: r_2 < 2(\sqrt{2})d \leq r_2\}$.

The input saturation level can be defined as $r_{SAT} = \zeta_k d$ where $k \in \{1,2\}$ and denotes an index specifying one of the domains in the previous equation. Under equation for $D_1$, the outer four points of the 16-QAM constellation are compressed onto a circle of radius $r_{SAT} = \zeta_1 d$ and $E_S = \lambda_1 d^2$ where $\lambda_1 = (\zeta_1^2 + 22)/4$. In the more extreme case of $D_2$, the twelve outer points are compressed onto a circle of radius $r_{SAT} = \zeta_2 d$ and $E_S = \lambda_2 d^2$ where $\lambda_2 = (\zeta_2^2 + 2/3)/4$. The symbol error probability parameterized in terms of the total gain a under equations $D_1$ and $D_2$ may be determined in a straightforward manner using probabilities P1, P2, P3, and P4 defined by respective probability equations, where $P_1 = Q(\sqrt{(2\gamma_S/\lambda_k)})$, $P_2 = Q(\sqrt{((2(2-\alpha)^2\gamma_S)/\alpha^2\gamma_S)})$, $P_3 = Q(\sqrt{((2(3\alpha-2)^2\gamma_S)/\alpha^2\lambda_k)})$, and $P_4 = Q(\sqrt{((2(\alpha\zeta_k(\sqrt{2}/2)-2)^2\gamma_S)/\alpha^2\lambda_k)})$.

In the probability equation, Q(x) is the complementary error function. The symbol error probability $P_S(E)$ under equation $D_1$ may be expressed using the probability equations. The bit error rate (BER) is equal to $P_S(E)$ divided by the number of bits per symbol, where $P_S(E) = p_1(1-(\frac{1}{4})p_1) + p_2(1-(\frac{1}{4})p_2) + (\frac{1}{2})p_3(1-p_1-p_2) - (\frac{1}{2})p_1p_2 + (\frac{1}{2})p_4(1-(\frac{1}{2})p_4)$. The symbol error probability $P_S(E)$ under the $D_2$ equation may be expressed as $P_S(E) = 1-(\frac{1}{4})(1-p_1-p_2)-(\frac{1}{4})(1-p_4)-(\frac{1}{2})(1-q_1)(1-q_2-q_3)$, where $q_1$, $q_2$, and $q_3$ are probabilities defined by respective q1, q2, and q3 probability equations, where $q_1 = Q(\sqrt{((2(3\alpha\zeta_2(\sqrt{10})/10-2)^2\gamma_S)/\alpha^2\lambda_2)})$, $q_2 = Q(\sqrt{((2(2-\alpha\zeta_2(\sqrt{10})/10)^2\gamma_S)/\alpha^2\lambda_2)})$ and $q_3 = Q(\sqrt{(\zeta_2^2\gamma_S/5\lambda_2)})$.

The optimal value of Z for a given level of distortion can be derived numerically by minimizing the $P_S(E)$ equation with respect to over all gain α. The optimal z is then equal to the overall gain a divided by the AGC gain A. The probability error minimization of equation $P_S(E)$ can be accomplished using any of the well known numerical methods.

A BER adaptive implementation uses the BER parameter concurrently. A large training sequence can be used for determining the parameters. The BER adaptive processor adjusts the scaling factor Z such that the BER parameter is minimized. The BER adaptive processing includes a sign generator, a BER direction holder, and an accumulator. The sign generator includes a first delay ΔT1, a sign summer, and a sign determinator. The first delay ΔT1 delays the current BER parameter, which is being received into a previous BER parameter. The sign summer forms a difference between the current BER parameter as an input and the previous BER parameter from the first delay. The ΔT1 is equal to the update rate of the BER parameter. The update rate is determined by the implementation of the parameter estimator. The subscript k is used to identify the values computed at the $k^{th}$ update interval. The sign determinator quantizes the difference between current and previous values of the BER parameter to either +1 or −1, respectively indicating the BER is increasing or decreasing. The BER direction holder maintains the same BER direction value +1 or −1 as a held BER direction signal until the sign of the BER direction from the sign determinator changes states. The BER direction holder allows the scaling factor, and hence, the over all gain, to increase or decrease monotonically as long as the BER parameter is improving. The BER held direction signal is received by the accumulator including an accumulator summer and a third delay ΔT3. The accumulator increases or decreases the gain value Z depending on the BER held direction signal. The scaling factor Z is increased or decreased in small steps. The scaling factor continues to increase or continues to decrease as long as the BER is being reduced.

The BER adaptive processor approach is more complex than the precomputed method, but works well under a wider range of conditions. The BER adaptive processor can be implemented either in software or in hardware. The implementation of the BER adaptive processor relies upon a BER parameter The BER is computed at regular intervals k to update the scaling factor Z where $e_k=BER_{k-1}-BER_k$, $d_k=d_{k-1} \cdot sign(e_k)$, and Z=Accumulator($d_k$).

The actual BER may not necessarily be the best metric for adaptation. The instantaneous BER is impractical to obtain in a typical system without use of a long training sequence. A frame or packet error rate is easier to observe by checking a CRC for every block. That is, the BER parameter can be a frame or packet error rate parameter. Another BER parameter may be the correction count output of a forward error correction block. Most modern forward error correction algorithms provide some indication of the number of corrections being made. Any metric that is monotonically related to the BER can be used. The optimality criterion is defined as the minimum bit error rate (BER). The optimal over all gain $\alpha_{opt}$ depends strongly on the amount of the distortion and weakly on the signal to noise ratio, where $\alpha_{opt}=Z \cdot A$.

Figure 3:
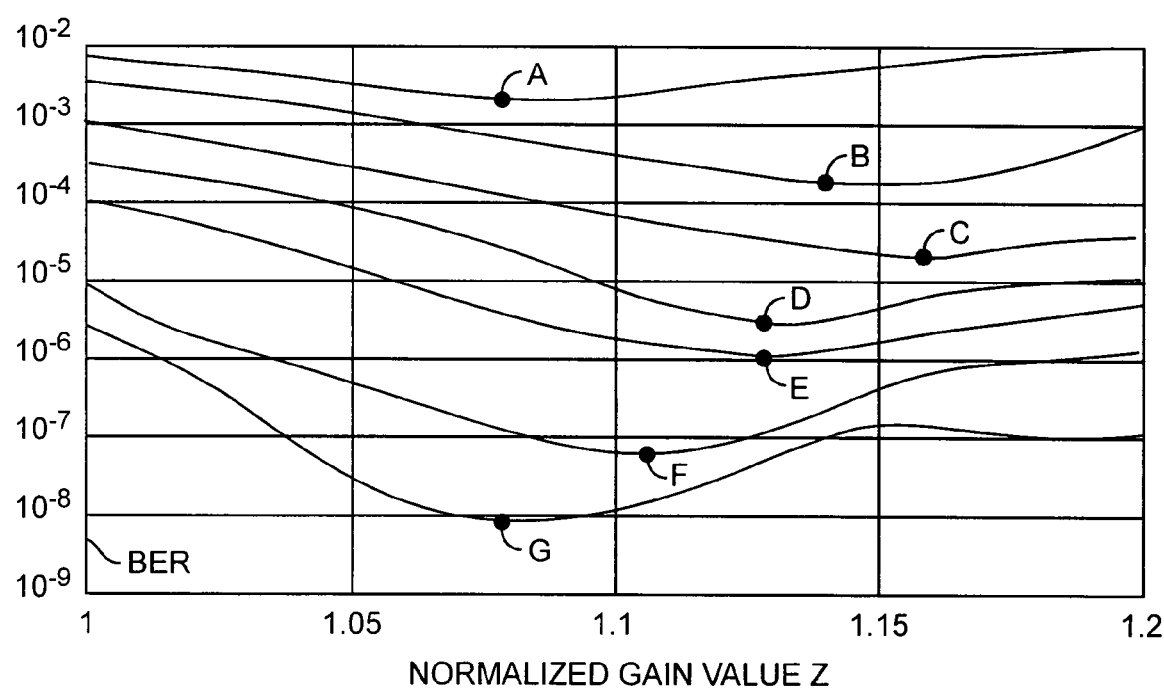
FIG. 3 is a block diagram of a BER adaptive processor.

Referring to all of the Figures, and more particularly to FIG. 3 showing performance curves A through G, the method can be implemented on conventional real-time hardware platforms to validate the effectiveness of the method. As can be seen, changing the scaling factor z from one to the optimal value reduces the number of errors by up to a factor of one hundred. This performance difference may be critical to achieving the target BER. Moreover, the improvement may be critical in achieving the target BER in a system employing forward error correction because even a small change in uncoded BER can result in a dramatic change in the coded BER. The operation of the BER adaptive algorithm processor can be understood by considering the measurement results of curves A-G. Each of the curves A-G corresponds to a different distortion level. As may be apparent, the BER decreases as the normalized gain value Z increases from one. At some point, determined by the distortion level, the optimal value of Z is reached which corresponds to the minimum BER. Increasing z beyond this optimal point causes the BER to increase. The direction holder allows Z to increase as long as BER decreases and then maintains Z around the optimal point. Various performance levels can be acquired by changing the scaling factor Z to an optimal value for reducing the number of errors by up to a factor of a hundred. This performance difference may be critical to achieving the target BER. Moreover, the adaptation may be critical in achieving the target BER in a system employing forward error correction because even a small change in uncoded BER can result in a dramatic change in the coded BER.

The controller can be implemented with a minor modification to a communications receiver that improves the performance in the presence of nonlinear distortion. The controller is directly applicable to almost all receivers that use high order modulations, such as 16-QAM. Distortion due to nonlinear amplification is encountered both in space-based and terrestrial communications. For example, the controller can be used for cellular base stations employing high-power amplifiers that become nonlinear close to saturation. The controller in a cell phone receiver would improve the receiver performance and allow the network operator to operate closer to saturation. The decrease in the BER would in turn increase the coverage area of each base station and reduce overall network cost. The approach is also applicable to satellite communications, including but not limited to satellite TV broadcast. While various algorithms can be used, look up tables and adaptive computation may be used for determining the scaling factor. Those skilled in the art can make enhancements, improvements, and modifications to the invention, and these enhancements, improvements, and modifications may nonetheless fall within the spirit and scope of the following claims.

What is claimed is:

1. A controller for providing an output signal from an input signal, the input signal and output signal are m-ary signals modulated within a constellation space defining communicated symbols communicated in the input signal, the controller comprising, a gain controller for receiving the input signal and providing automatic gain control of the input signal for generating an adjusted input signal, the automatic gain control serving to align the adjusted input signal to the constellation space, and a scaling processor for receiving the adjusted input signal and scaling the adjusted input signal into the output signal, wherein, the scaling processor comprises, an adaptive processor receiving a parameter for generating the scaling factor, the parameter indicating a bit error rate, a parameter estimator for estimating a parameter indicating the bit error rate, and a multiplier for scaling the adjusted input into the output, wherein, the output carries the symbols that are misaligned to the constellation space generating the bit error rate, the scaling factor is adjusted by the scaling processor to minimize the bit error rate, and the parameter is selected from a plurality of signal to noise ratio parameters precomputed prior to receiving the input signal.

2. The controller of claim 1 wherein, the scaling factor is adjusted by the scaling processor to minimize the bit error rate.

3. The controller of claim 1 wherein,
the parameter is an input indicating a packet error rate.

4. The controller of claim 1 wherein,
the parameter is an input indicating a correction count.

5. The controller of claim 1 wherein,
the controller receives as input the parameter.

6. The controller of claim 1 wherein,
the constellation space is a 16-ary constellation space.

7. The controller of claim 1 wherein, the adaptive processor is for increasing and decreasing the scaling factor to minimize the bit error rate.

* * * * *